United States Patent [19]

Lüscher et al.

[11] 4,311,923

[45] Jan. 19, 1982

[54] DEVICE FOR REGULATING THE THRESHOLD VOLTAGES OF I.G.F.E.T. TRANSISTORS CIRCUITRY

[75] Inventors: Jakob Lüscher, Venthône; Andreas Rusznyak, Chêne-Bougeries, both of Switzerland

[73] Assignee: Ebauches SA, Neuchatel, Switzerland

[21] Appl. No.: 50,879

[22] Filed: Jun. 21, 1979

Related U.S. Application Data

[63] Continuation-in-part of Ser. No. 922,500, Jul. 6, 1978, abandoned.

[30] Foreign Application Priority Data

Jul. 8, 1977 [CH] Switzerland ............................ 8454/77

[51] Int. Cl.³ .................... H03K 17/14; H03K 17/30; H03K 3/353
[52] U.S. Cl. ................................. 307/304; 307/297; 307/578
[58] Field of Search ................. 307/200 B, 251, 246, 307/297, 304, DIG. 4

[56] References Cited

U.S. PATENT DOCUMENTS

| T 954,006 | 1/1977 | Lee et al. .......................... 331/57 X |
|---|---|---|
| 3,609,414 | 9/1971 | Pleshko et al. .................. 307/304 X |
| 3,657,575 | 4/1972 | Taniguchi et al. ................. 307/304 |
| 3,794,862 | 2/1974 | Jenne .................................... 307/304 |
| 3,805,095 | 4/1974 | Lee et al. ............................ 307/304 |
| 3,806,741 | 4/1974 | Smith ................................... 307/304 |
| 3,845,331 | 10/1974 | Luscher ............................. 307/304 |
| 3,956,714 | 5/1976 | Luscher ................... 307/DIG. 4 X |
| 4,016,476 | 4/1977 | Morokawa et al. ...... 307/DIG. 4 X |
| 4,049,980 | 9/1977 | Maitland ......................... 307/297 X |
| 4,115,710 | 9/1978 | Lou ................................... 307/297 X |
| 4,142,114 | 2/1979 | Green ............................... 307/297 X |

FOREIGN PATENT DOCUMENTS 2152031   4/1973   France .

OTHER PUBLICATIONS

Frantz, *IBM Technical Disclosure Bulletin*, vol. 12, No. 12, p. 2078; 5/1970.
Kubo et al., *1976 IEEE Int'l. Solid-State Circuits Conference;* 2/18/76; pp. 54–55, *Digest of Technical Papers.*
Hummel, *IBM Technical Disclosure Bulletin;* vol. 15, No. 2, pp. 478–479; 7/1972.
Blaser et al., 1976 IEEE Int'l. Solid-State Circuits Conference; Digest of Technical Papers; 56–57; 2/18/76.

*Primary Examiner*—Larry N. Anagnos
*Attorney, Agent, or Firm*—Karl F. Ross

[57] ABSTRACT

To regulate the threshold voltage of insulated-gate field-effect transistors (IGFETs) in an integrated circuit, such as that of an electronic wristwatch, capacitors and other IGFETs of the same conductivity type as those of the controlled circuit are incorporated in the substrate thereof to form a regulating transistor, a constant-current generator and one or more voltage multipliers. The current generator and the main electrodes (source and drain) of the regulating transistor, whose gate is tied to its source, are connected in series across a generator of reference voltage constituted by one or more such multipliers. One of the main electrodes of the regulating transistor is connected, directly or through a further voltage multiplier, to the reference terminal (O) of the controlled circuit while still another such multiplier may be inserted between the ouptut of the constant-current generator and the interconnected source and gate electrodes of the regulating transistor. The current generator may comprise a storage capacitor periodically charged through a first IGFET ($T_1$) in the presence of the leading edge of an applied pulse, such as a half-cycle of a square wave, and discharged through a second IGFET ($T_2$) on the trailing edge thereof.

7 Claims, 7 Drawing Figures

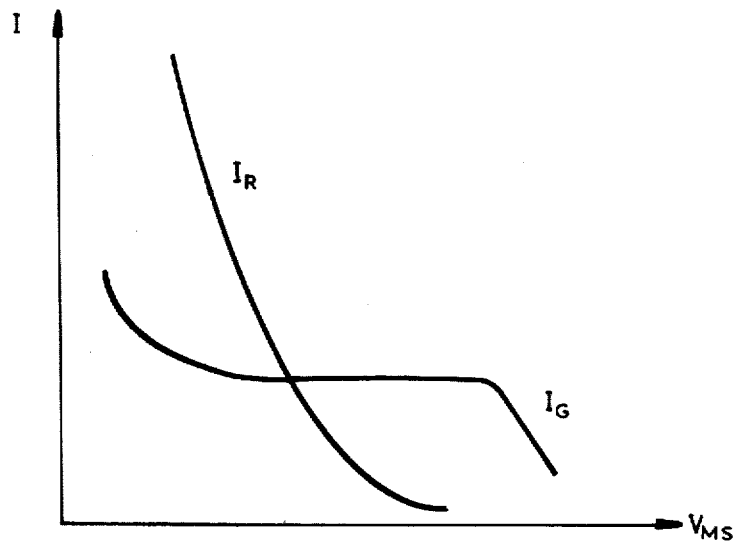
FIG.4
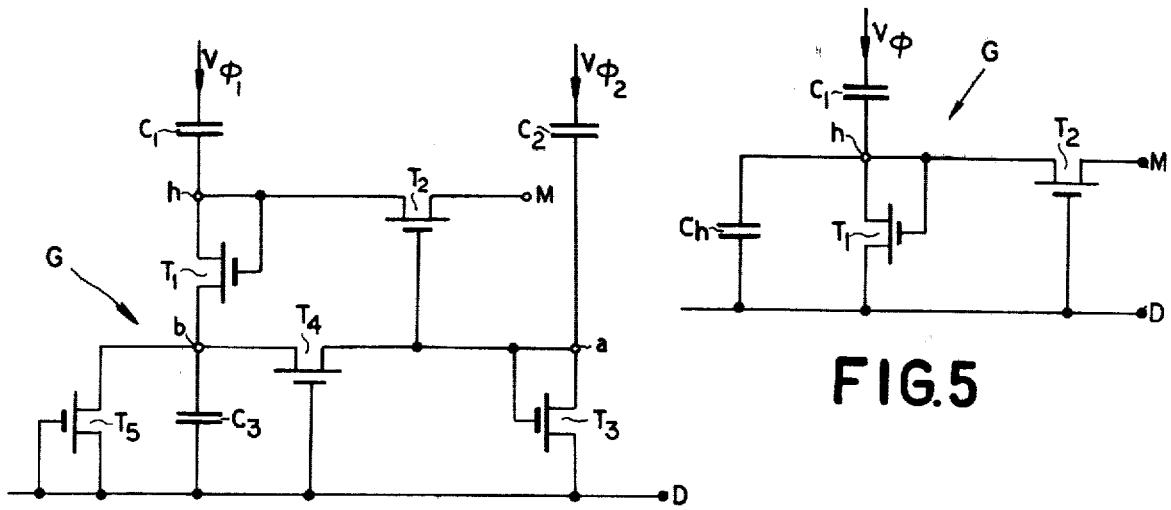
FIG.6
FIG.5
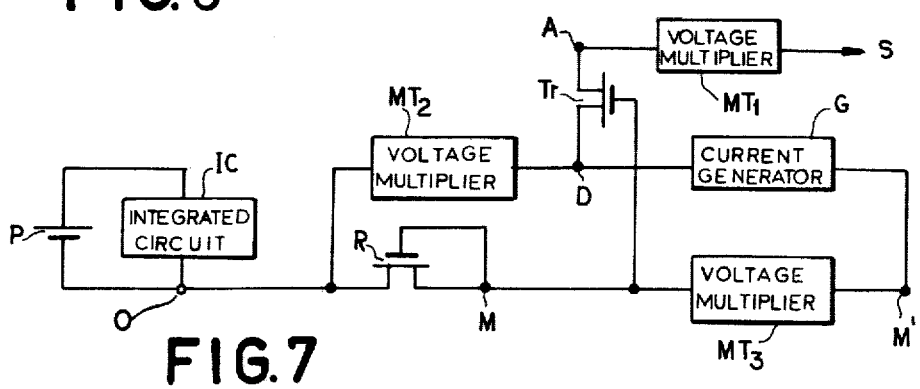
FIG.7

DEVICE FOR REGULATING THE THRESHOLD VOLTAGES OF I.G.F.E.T. TRANSISTORS CIRCUITRY

CROSS-REFERENCE TO RELATED APPLICATION

This is a continuation-in-part of our copending application Ser. No. 922,500 filed July 6, 1978, now abandoned.

FIELD OF THE INVENTION

Our present invention relates to a device for regulating the threshold voltage of IGFET transistors of integrated circuits.

BACKGROUND OF THE INVENTION

One of the important parameters having an influence on the performance of an MOS integrated circuit, which includes insulated-gate field-effect transistors (IGFETs), is the value of the threshold voltage of these transistors. The performance in question can be for example their operational limit as a function of their supply voltage or of the temperature.

In the manufacture of circuits of this type it is relatively easy to minimize the spread of the values of the threshold voltage of transistors located on the same chip, this spread being essentially due to the "flat-band" voltage. The situation is, however, not the same so far as the spread of values between transistors located on different chips is concerned, particularly if, although obtained by the same manufacturing operation, these chips belong to different batches. This is why the attempt has been made to design systems which regulate, by electronic means, the threshold voltage of the transistors of an integrated circuit to a well-defined value.

MOS integrated circuits are already known which embody such regulating means operating by the biasing of the substrate of the transistors concerned. Reference may be made in this connection to U.S. Pat. No. 3,806,741 and to a publication by Eugene M. Blaser, William M. Chu and George Sonoda entitled "Substrate Load Gate Voltage Compensation" (Digest of Technical Papers, 1976 IEEE International Solid-State Circuits Conference, pp. 5657).

In these systems, the regulation is achieved by comparing a reference voltage, derived from the supply voltage, with the threshold voltage of a transistor; the difference of these voltages, constituting an error signal, controls an inverter which amplifies it. The amplified signal modulates a pulse generator whose output voltage is rectified and constitutes the biasing voltage of the substrate, which is adjusted in such a way that the error signal is close to zero.

If it is desired to employ such a system to perform regulation of the threshold voltage of transistors of an MOS integrated circuit of a quartz wristwatch, for example, problems of energy consumption have to be faced.

In a portable unit such as a wristwatch, the space available for the constituent elements is very restricted. Thus, the capacity of the energy source which it contains and which is usually a cell of small dimensions is also very limited. To ensure self-sufficiency of long duration, e.g. of several years, it is necessary that the consumption of the complete electronic system be very small.

Electronic circuits of low energy consumption have already been proposed and permit a rationalized manner of manufacture, embodied in the form of MOS integrated circuits containing only transistors of a single conduction type and capacitors. Such circuits are described, for instance, in U.S. Pat. Nos. 3,956,714, 3,932,773 and 3,983,411. They are advantageously embodied by integration in substrates of relatively low doping. This reduces, on the one hand, the effect of variations of the threshold voltage of their transistors as a function of the source potential thereof (body effect) and, on the other hand, the parasitic capacitance of the different diffused zones with respect to the substrate.

Given that the threshold voltage of MOS transistors varies only with the square root of the biasing voltage applied between their source and the substrate, regulation of the threshold voltage by means of such a bias in a relatively large domain, e.g. several tenths of a volt, requires that the biasing voltage of such a substrate, weakly doped, should attain values which are a multiple of the cell voltage (1.3 to 1.5 volt) usual in electronic wristwatches.

OBJECT OF THE INVENTION

The object of our present invention, accordingly, is to provide an improved voltage-regulating device for the purpose set forth which satisfies the aforestated desiderata.

SUMMARY OF THE INVENTION

We realize this object, in accordance with our present invention, by the provision of a regulating transistor of the IGFET type connected in series with a constant-current generator across a voltage generator, which may comprise one or more voltage multipliers, all incorporated in the same substrate as the circuit controlled thereby; the reference terminal of the latter circuit is connected, directly or with interposition of a further voltage multiplier, to one of the main electrodes (source and drain) of the regulating IGFET whose gate is connected to its source and to the output of the current generator, again with possible interposition of another voltage multiplier.

Pursuant to another feature of our invention, the current generator comprises a storage capacitor which is periodically charged through one transistor of a pair of associated IGFETs in the presence of the leading edge of an applied pulse, which may be a half-cycle of a square wave, and is discharged through the other transistor of that pair on the trailing edge of that pulse.

A preferred device embodying our invention, designed to consume very little energy (e.g. only some tengths of a microampere), includes transistors of only one conductivity type together with several capacitors.

BRIEF DESCRIPTION OF THE DRAWING

The above and other features of our invention will be described in detail hereinafter with reference to the accompanying drawing in which:

FIG. 4 is an explanatory diagram;

FIG. 5 is a more detailed circuit diagram of a component of the embodiments shown in FIGS. 1–3;

FIG. 6 is a circuit diagram similar to FIG. 5, showing a modification; and

FIG. 7 is a block diagram of a modified circuit arrangement similar to that of FIG. 3.

SPECIFIC DESCRIPTION

Figure 1:
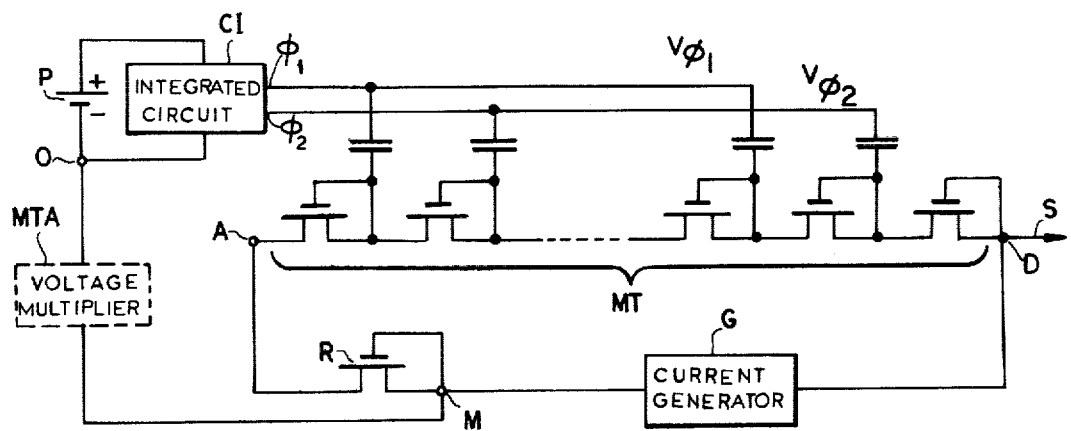
FIGS. 1, 2 and 3 show circuit diagrams of three embodiments of our invention.

Before commencing the description of the main features of the illustrated embodiments, we shall recall some fundamental well-known characteristics of field-effect MOS transistors of the insulated-gate (IGFET) type.

As is known, the relationship between the saturation current $I_S$ and the gate voltage $V_G$ of an MOS transistor can be characterized, over a wide range, by the well-known expression $$I_S = K(V_G - V_T)^2 \quad (1)$$

where K is the slope of the transistor in $A/V^2$ (amps per volts squared). This slope is proportional to W/L, where W is the width and L the length of the channel. It is usual to define the threshold voltage $V_T$ as the value existing at the intersection of the right-hand part of the graph $\sqrt{I_S} = f(V_G)$ with the voltage axis; $V_T$ is therefore an extrapolated value.

For voltages $(V_G - V_T)$ near O, this equation (1) is no longer valid. The saturation current $I_S$ through the transistor for $V_G = V_T$ can, however, be calculated from the expression:

$$I_S = K \cdot V_{GO}^2 \quad (2)$$

where $V_{GO}$ is a reference voltage depending on the doping of the substrate and on the thickness of the oxide layer.

For voltages $V_G - V_T < 0$ (region of weak inversion), the ratio between the saturation current $I_S$ and the gate voltage $V_G$ is exponential in a wide range of the current $I_S$ (several powers of ten). Assuming that this exponential relationship characterizes the transistor also for voltages up to $V_T - V_G = 0$, an assumption which can be justified when one considers the regulating device in question, function $I_S = f(V_G)$ can be replaced, in this regime, by the expression $$I_S = K V_{GO}^2 \cdot \exp[\beta(V_G - V_T)] \quad (3)$$

where $\beta$ depends essentially on the thickness of the oxide layer and on the doping of the substrate.

The threshold voltage of an MOS field-effect transistor is usually considered as the one observed without biasing of the integration substrate with respect to the source electrode of the transistor in question. In U.S. Pat. No. 3,845,331 it has already been shown that the effect which can be obtained by biasing the substrate of such a transistor, given the proportionality of the square root of the saturation current $I_S$ of the transistor to the gate voltage $V_G$, translates into a displacement of this characteristic along the $V_G$ axis. The importance of this shift can be calculated from the following relationship:

$$V_T = V_{FB} + 2\psi_B - \frac{\sqrt{2\epsilon_{Si} q N_B}}{C_{OX}} \sqrt{V_S + 2\psi_B} \quad (4)$$

where $V_{FB}$ = the "flat-band" voltage,
$\psi_B$ = the Fermi potential of the semiconductor,
$\epsilon_{Si}$ = the dielectric constant of the silicon substrate,
q = the charge of an electron,
$N_B$ = the doping of the silicon substrate,
$C_{OX}$ = capacitance per unit surface of the oxide under the gate,
$V_S$ = biasing voltage of the source electrode of the transistor with respect to the substrate.

The threshold voltage, therefore, varies linearly as a function of $\sqrt{V_S + 2\psi_B}$ with a slope which depends on the doping of the substrate and on the capacitance of the oxide under the gate.

In the description which follows and in the drawing to which it refers, only circuits embodying transistors of n+ type integrated in a p-type substrate will be considered. It is clear, however, that these same circuits could equally well be realized by integration of p+ zones in an n-type substrate.

The device shown in FIG. 1 is designed to ensure regulation of the threshold voltage of nonillustrated IGFETs incorporated in an integrated circuit CI, which is specifically designed for an electronic wristwatch and contains for example a symmetrical oscillator of the kind described in U.S. Pat. No. 3,956,714 as well as a frequency divider such as that described in U.S. Pat. No. 3,983,411. This circuit CI is fed by a cell P, providing a voltage of 1.5 volts for example, and delivers at its two outputs $\phi_1$ and $\phi_2$ periodic signals $V_{\phi 1}$ and $V_{\phi 2}$, respectively, in phase opposition.

As can be seen from FIG. 1, the regulating circuit comprises an IGFET R realized by integration in the same substrate as the circuit CI and of the same conductivity type as the field-effect transistors of that circuit whose threshold voltage is to be regulated. This regulating circuit additionally comprises a reference-current generator G, whose constructional characteristics will be described hereinafter, and a conventional voltage multiplier MT which may be, for instance, of the type described in U.S. Pat. No. 3,845,331 and is seen to comprise a cascade of IGFETs alternately controlled by the signals $V_{\phi 1}$, $V_{\phi 2}$ delivered by the integrated circuit CI at its outputs $\phi_1$ and $\phi_2$.

The multiplier MT produces between a point A and a point S, which is connected to the substrate, a voltage whose value depends on the number of stages of the multiplier and which is relatively high. This supply voltage feeds the transistor R, whose gate is connected to its source, together with the reference-current generator G, connected in series therewith between the points A and S referred to above. The generator G is so designed that its output current is, to a great extent, independent of the voltage which exists between the substrate and the junction point M between the generator and the transistor R; point M constitutes an output terminal of generator G which also has a biasing terminal D linked in FIG. 1 directly to the substrate S. Since this generator is connected in series with the transistor R, the current which it delivers is applied to the latter so that the voltage between the point M and the substrate is adjusted to the value needed for passage of this current.

When the device is connected in circuit, the current of the transistor R is at first greater than that which is delivered by the generator G and the difference between these two currents charges the capacitance which exists between the point M and the substrate S. Thus, the potential of the substrate S becomes negative with respect to the junction point M and this voltage, which biases the regulating transistor R, has an influence on its threshold voltage $V_T$ such that the value of the threshold increases—see equation (4)—and that, as a result, its saturation current decreases. Equilibrium is established in such a manner that the current through transistor R is equal to that delivered by the generator G. The fundamental properties of the MOS transistors enable calculation of the threshold voltage $V_T$ of the regulating transistor R which will be obtained when a state of equilibrium has been reached.

As the gate of the regulating transistor R is connected to its source ($V_G=0$), this transistor having a slope $K_R$, its threshold voltage $V_T$ is calculated, from equation (3), as $$V_T = (1/\beta) \ln (K_R \cdot V_{GO}^2)/I_G) \qquad (5)$$

This voltage $V_T$ can also be expressed as a function of the voltage $\Delta V_G$ which is necessary to change by a factor of 10 the value of the saturation current of a transistor in the weak-inversion, namely by $$V_T = \Delta V_G \log_{10} (K_R V_{GO}^2/I_G) \qquad (6)$$

If the two equations (5) and (6) are compared, it can be seen that the ratio between $\Delta V_G$ and $\beta$ is given by $$\Delta V_G = 1/\beta \log_{10} e \qquad (7)$$

($e = 2.718282$, the base of natural logarithms).

With typical values for this type of integrated circuit such as $V_{GO} = 0.04$ V and $\Delta V_G = 0.08$ V, we obtain with $K_R = 4.10^{-4} A/V^2$ and $I_G = 4.10^{-8} A$, for example, an extrapolated threshold voltage $V_T = 0.1$ V. This threshold voltage, which is therefore that of the regulating transistor R, will also be characteristic for the field-effect transistors of the circuit CI, whose sources are connected to the common point M of this circuit also tied to the source of this transistor R. Thus, by means of the regulating device described, the threshold voltage of the transistors of the integrated circuit CI is regulated essentially by a suitable choice of the parameters $K_R$ and $I_G$ at a predetermined value. It may be mentioned that the biasing voltage which would be necessary to obtain an extrapolated voltage $V_{TO}$ in the unbiased condition of the substrate would be, in the example given above, $-0.7$ V for $V_{TO} = 0$ V and $-6$ V for $V_{TO} = -0.4$ V.

In case it is required to have a threshold voltage $V_T$ of higher value, an additional voltage multiplier MTA could be inserted between points M and 0 (as indicated by dotted lines in FIG. 1), with an insignificant decrease in the efficiency of regulation.

Thus, with an additional voltage of 1 V, which can be produced with a single-stage voltage multiplier, the threshold voltage $V_T$ would be 0.2 V for $V_{TO} = 0$ and $V_T = 0.18$ V for $V_{TO} = -0.4$ V.

The second embodiment (FIG. 2) is distinguished from the preceding one, on the one hand, by the fact that the voltage multiplier MT which feeds the drain of the regulating transistor R in FIG. 1 is replaced by a series arrangement of two mutually distinct multipliers $MT_1$ and $MT_2$ and, on the other hand, by the fact that biasing terminal D of current generator G is connected to the junction point B of these two multipliers. This arrangement enables a very favorable biasing of the elements of the reference-current generator G as concerns the structure of this generator.

In this case, also, it is possible to connect the reference line of the integrated circuit CI (tied to the negative battery terminal 0) to the point M of the regulating device through an additional voltage multiplier MTA in such a way as to increase the magnitude of the available biasing voltage.

Figure 3:
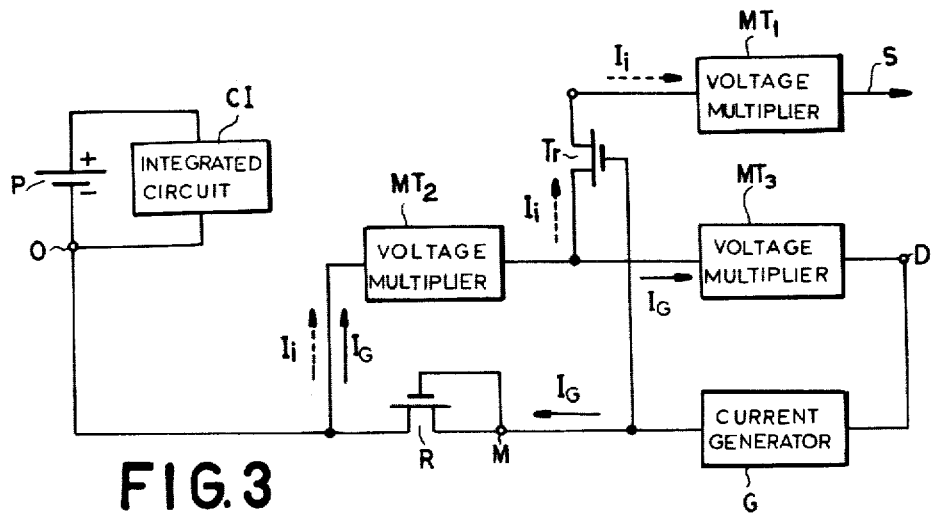

The embodiment of FIG. 3 comprises three voltage multipliers $MT_1$, $MT_2$ and $MT_3$, which can be of the type described in U.S. Pat. No. 3,845,331 and which all differ from one another in the number of their stages and thus in their multiplication factors. This third embodiment further includes an ancillary IGFET Tr which is connected with its source-drain path in series with the multipliers $MT_1$ and $MT_2$. The gate of this transistor is connected directly to the source of the regulating transistor R whereby the source potential of transistor Tr is very close to that of point M. The voltage obtained via multiplier $MT_2$ can be very low, e.g. of the order of 1 volt in the instance given above. The output voltage of multiplier $MT_3$ can be even lower, of the order of 0.5 volt, as long as the voltage of the generator G is sufficient to enable it to function correctly.

The availability, in this embodiment, of a reduced voltage between the point M and the junction D between multiplier $MT_3$ and generator G means that the elements of the current generator can benefit from a biasing voltage with respect to the substrate S which is again very favorable as concerns the construction of this generator.

It may further be noted that in this embodiment the negative terminal O of the integrated circuit CI is connected to the drain of the regulating transistor R, in contrast to the preceding embodiments in which this terminal is connected to the source of transistor R. With the circuitry of FIG. 3 it is possible to let the voltage multiplier $MT_2$ also play the part of the additional multiplier MTA shown in FIGS. 1 and 2. It will be remembered that this additional multiplier makes it possible to elevate the threshold voltage $V_T$ of the transistors of the integrated circuit CI with the aid of additional electronic step-up components.

It should also be observed that, in this embodiment, the electron current $I_G$, represented by arrows in FIG. 3, passes through the transistor R and through the voltage multipliers $MT_2$ and $MT_3$. However, since the voltages produced by these multipliers are reduced and as the current $I_G$ is weak, the consumption due to this current circulation is extremely reduced. The reverse electron current $I_i$ of all the junctions of the integrated circuit CI (whose circulation is indicated by dashed arrows) is conducted to the substrate S of the circuit via voltage multiplier $MT_2$, transistor Tr and multiplier $MT_1$. Since the multiplier $MT_2$ is already charged by the current $I_G$, the influence of the reverse current $I_i$ on its voltage is insignificant.

The operation of the regulating device according to our invention will now be explained with reference to the diagram of FIG. 4 which shows, on the one hand, the variation of the saturation current $I_R$ of the regulating transistor R as a function of its biasing voltage $V_{MS}$, applied between its source and the substrate, and, on the other hand, the variation of the assumed reference current $I_G$ of generator G as a function of the same voltage. Two possible structures for such a generator, delivering a current whose magnitude is substantially independent of its supply voltage and of any possible biasing voltage $V_{DS}$ applied between the common point of such a generator and the substrate, will be described hereinafter with reference to FIGS. 5 and 6. As voltage $V_{DM}$ existing between points D and M in FIG. 3 is composed of the voltage created by the multiplier $MT_3$ and the voltage existing between the gate and the source of the transistor Tr, both of reduced value, the magnitude of $V_{DM}$ is small. Thus, the current $I_G$ traversing both the generator G and the transistor R remains substantially independent of voltage $V_{MS}$ and $V_{DS}$ over a wide range, as particularly illustrated in FIG. 4 for the biasing voltage $V_{MS}$.

For a circuit CI constituting a complete system embodying an oscillator and a frequency divider, such as mentioned above, we prefer to choose a weakly doped substrate so that, without bias, the transistions have a threshold voltage of negative value; in the case of transistors of conductivity type n, the bias will make this voltage positive. Near the lower and upper limits of the range of voltage $V_{DS}$ the current $I_G$ varies inversely with it; between these extremes the current is practically independent of $V_{DS}$ (and of $V_{MS}$, as seen in FIG. 4).

The mode of operation of the described device requires, in a state of equilibrium, that the current $I_R$ passing through the regulating transistor R should equal the output current $I_G$ of generator G. The biasing voltage for which this requirement is satisfied will therefore correspond to the intersection of the two curves $I_R$ and $I_G$ illustrated in FIG. 4.

Components R, G and the associated voltage generators represented by the multipliers MT, MT$_1$ etc. constitute very simple means enabling us to design an oscillator-voltage divider of the type described in U.S. Pat. No. 3,848,200, for example, in such a way that the threshold voltage of its transistors can be regulated with precision to a predetermined value even where the threshold voltage in the unbiased state varies widely. These components are fed by the oscillator and therefore form part of its resonant circuit. Because of this, and since the direct currents involved are of very low magnitude, the consumption caused by the regulating system is greatly reduced, typically to some tenths of a $\mu A$.

Component G generates a very low reference current. The availability of a voltage source which is periodic and of stable frequency and amplitude, specifically an oscillator in the present instance, makes possible the realization of such generators in the form of structurally simple MOS integrated circuits, including only transistors of a single conductivity type along with capacitors.

Figure 2:
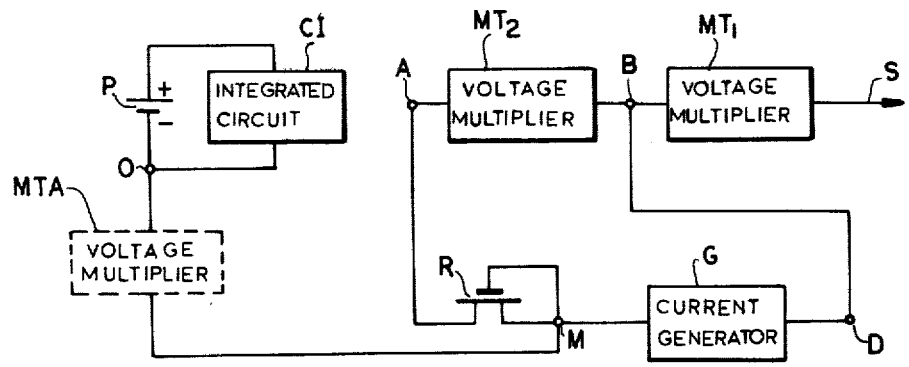

FIGS. 5 and 6 show two embodiments of a constant-current generator G according to FIGS. 1-3 in which a small capacitance is charged, at the cadence of the supply voltage, by the stable voltage of this supply or by a fraction thereof. We then transfer, with the same periodicity and through a transistor, all or part of the charge of this capacitance to the output of the generator which thus delivers the integral of these transferred charges in the form, on average, of a direct current of constant value.

In the construction of FIG. 5, the current generator comprises a capacitor $C_1$ connected to a supply of periodic voltage, such as a square wave or a pulse train, of amplitude $V_{100}$ and of frequency f, a first control IGFET $T_1$ connected in series between the capacitor and the biasing terminal D of the generator, the gate of this transistor being connected to its drain at a junction h, and a second control IGFET $T_2$ whose main electrodes (source and drain) lie between this junction and point M and whose gate is tied to point D. These components are formed by integration in the same substrate as the circuit CI of FIGS. 1-3. Furthermore, the transistors $T_1$ and $T_2$ are of the same conductivity type as the transistors of circuit CI and thus also as the regulating transistor R.

A capacitor $C_h$ represents the parasitic capacitance, with respect to the substrate, of the circuit components connected to junction point h. It should be noted that the capacitance of points D and M with respect to the substrate is very large so that there is practically no alternating voltage present at these points.

The described generator works as follows: during the first half of each cycle of voltage $V_\phi$, the capacitor $C_1$ is charged through the transistor $T_1$. During the second half-cycle, this charge is transferred by the transistor $T_2$ to the output M. The current resulting from these periodic packets of charge is practically independent of the voltage between the points D and M which has an order of magnitude exceeding a tenth of a volt. For threshold voltages $V_T$ which are greater than zero, the current $I_G$ of this generator is given by the relationship $$I_G \approx 2 \cdot [C_1 V_\phi - (C_1 + C_h) V_T] \cdot f \tag{7}$$

The dependence of this current $I_G$ on any variation of the threshold voltage $V_T$ is given by the relationship $$(dI_G/dV_T) \approx -2(C_1 + C_h)f \tag{8}$$

In an integrated circuit, the values of the capacitances $C_1$ and $C_h$ can be of the order of 0.04 pF and 0.1 pF, respectively. For values of $V_\phi = 1.4$ V, $V_T = 0.2$ V and $f = 780$ KHz (oscillator with a quartz of SL section), we obtain $I_G = 4.10^{-8}$ and $(dI_G/dV_T) = 2.10^{-7}$ A/V or a current dependence $I_G$ on the threshold voltage $V_T$ of $2.10^{-8}$ A per tenth of a volt. In view of the transmission of the current $I_G$ through the regulating transistor R, this dependence can be considered relatively small since the current $I_G$ would have to change by more than an order of magnitude to change the regulated threshold voltage by a tenth of a volt.

The accuracy of regulation of the threshold voltage can be increased by making use of a generator G as shown in FIG. 6.

This generator comprises three capacitors $C_1$, $C_2$ and $C_3$ and five control IGFETs $T_1$ to $T_5$ of the same polarity as the transistors of the circuit CI of FIGS. 1, 2 and 3, being integrated in the same substrate as this circuit.

The capacitors $C_1$ and $C_2$ connected to a supply of periodic voltage pulses $V_{\phi 1}$, fed to capacitor $C_1$, and $V_{\phi 2}$, fed to capacitor $C_2$, these pulses alternating with each other.

The capacitor $C_1$ is connected in series with the main electrodes of transistor $T_1$ and is tied at h to the drain thereof as well as to its gate. One of the main electrodes of transistor $T_2$ is again connected to the junction point h between transistor $T_1$ and the capacitor $C_1$, its other main electrode being tied to the point M.

The capacitor $C_2$ is connected in series with the main electrodes of transistor $T_3$, being tied at a to the drain thereof as well as to its gate; the source of transistor $T_3$ is tied to the point D which in turn is connected to the substrate s of the integrated CI (FIG. 1), to the junction point B (FIG. 2), or to the multiplier MT$_3$ (FIG. 3).

The gate of transistor $T_2$ is connected to the junction point a between capacitor $C_2$ and transistor $T_3$ as well as to one of the main electrodes of transistor $T_4$ whose other main electrode is tied to the source of transistor $T_1$ at point b. The gate of transistor $T_4$ is connected to point D.

The main electrodes of transistor $T_5$ and the capacitor $C_3$ are connected in parallel between point D and the source of transistor $T_1$, the gate of transistor $T_5$ being connected to point D. Capacitor $C_3$ should have a relatively high value, of the order of 1 pF for example.

Since transistor $T_3$ is connected as a diode (gate tied to drain), the voltage at the point a with respect to the point D scarcely exceeds, upon the occurrence of the leading edge of pulse $V_{\phi 2}$, the threshold voltage $V_T$. When pulse $V_{\phi 2}$ decays, a voltage opposite in sign to $V_T$ establishes itself at point a so that the most negative value of the voltage $V_a$ at this point surpasses the inverted threshold $-V_T$. As soon as the voltage $V_a$ is more negative than $-V_T$, the transistor $T_4$ conducts and the current through this transistor charges the capacitor $C_3$ to a voltage $V_b$ which is also negative with respect to the point D. This voltage $V_b$ is limited by the transistor $T_5$ to about $-V_T$.

When the transistor $T_1$ conducts, the effect of its threshold voltage is compensated by the voltage $V_b = -V_T$ and thus the capacitor $C_1$ is charged to a value equal to $2V_{\phi 1}$. When the transistor $T_2$ conducts, this conduction is controlled by the voltage difference then existing between points a and D, equal to $V_T$. The effect of the threshold voltages of the transistors $T_1$ and $T_2$ is thus compensated and the current becomes independent thereof so that $$I_G \approx 2C_1 \cdot V_{\phi 1} \cdot f \qquad (9)$$

It is necessary, of course, to dimension the circuit in such a way that the voltage of the point a can effectively attain the value $+V_T$.

The periodic voltages $V_{\phi 1}$ of FIG. 5 and $V_{\phi 2}$ of FIG. 6 could be derived from the output terminals $\phi_1$ and $\phi_2$ of circuit CI shown in FIG. 1.

In FIG. 7 we have shown a modification of the system of FIG. 3 in which the third voltage multiplier $MT_3$ has been relocated to a position between point M and current generator G. This is designed to subject the transistors of that generator (shown in FIG. 5 or 6) also to the regulated threshold voltage.

Thus, terminal D of generator G is connected in FIG. 7 directly to the source of ancillary IGFET Tr whose potential is rather close to that of the common point M; this terminal, therefore, is biased with respect to the substrate S by a voltage corresponding substantially to that of the interconnected source and gate electrodes of regulating IGFET R.

Since the reverse current $I_i$ (FIG. 3) traversing the transistor Tr is very small, the source potential of this transistor may exceed its gate voltage. For a correct operation of generator G it is desirable to have available at its other terminal M', constituting the generator output, a voltage greater than zero with reference to its biasing terminal D. The insertion of voltage multiplier $MT_3$ between points M and M' achieves this aim.

In both FIGS. 3 and 7 the common point 0 of the controlled circuit IC may be connected to the source (point M) rather than to the drain of regulating IGFET R, possibly through a further voltage multiplier MTA, as illustrated in FIGS. 1 and 2.

We claim:

1. A circuit arrangement for establishing a predetermined threshold voltage for insulated-gate field-effect transistors of a given conductivity type, integrated in a substrate and provided with a common reference terminal, by subjecting said substrate to a controlled biasing potential, comprising:

a regulating IGFET of said given conductivity type having a source and a drain constituting two main electrodes and further having a gate connected to said source;

a current generator having a biasing terminal connected to said substrate and an output terminal connected to said source;

a d-c voltage generator connected across the series combination of said current generator and said regulating IGFET; and a d-c connection between said reference terminal and one of said main electrodes;

said one of said main electrodes being biased to a potential enabling said regulating IGFET to pass the output current of said current generator.

2. A circuit arrangement as defined in claim 1 wherein said current generator comprises a first and a second control IGFET of said given conductivity type, said first control IGFET having a gate connected to one main electrode thereof and another main electrode connected to said biasing terminal, said second control IGFET having a gate connected to said biasing terminal and further having main electrodes inserted between said output terminal and said one main electrode of said first control IGFET, the latter electrode being further coupled through a capacitor to a supply of periodic voltage pulses.

3. A circuit arrangement as defined in claim 2 wherein the connection between the other main electrode of said first control IGFET and said biasing terminal includes pairs of main electrodes of a third and a fourth control IGFET of said conductivity type having a junction point connected to the gate of said second control IGFET, said biasing terminal being directly connected to a gate of said fourth control IGFET and to a main electrode of said third control IGFET other than the one connected to said junction point, the latter being coupled through a second capacitor to a supply of periodic voltage pulses alternating with those transmitted by the first-mentioned capacitor to said one main electrode of said first control IGFET; further comprising a third capacitor connected between said biasing terminal and said other main electrode of said first control IGFET, and a fifth control IGFET of said given conductivity type with main electrodes connected across said third capacitor and with a gate connected to said biasing terminal.

4. A circuit arrangement as defined in claim 1, 2, or 3 wherein said d-c voltage generator comprises one section of a multistage voltage multiplier having another section inserted in the connection between said biasing terminal and said substrate.

5. A circuit arrangement as defined in claim 4, further comprising an ancillary IGFET with main electrodes inserted between said sections and with a gate connected to the source of said regulating IGFET, and a further voltage multiplier inserted in series with said current generator between the source of said regulating IGFET and said one section of said multistage voltage multiplier.

6. A circuit arrangement as defined in claim 1, further comprising an ancillary voltage generator inserted in said d-c connection.

7. A circuit arrangement as defined in claim 1 wherein said d-c voltage generator consists of a plurality of cascaded voltage-multiplier stages alternately supplied with voltage pulses of two mutually interleaved pulse trains.

* * * * *